(12) United States Patent
Blanchard

(10) Patent No.: US 7,473,966 B1
(45) Date of Patent: Jan. 6, 2009

(54) OXIDE-BYPASSED LATERAL HIGH VOLTAGE STRUCTURES AND METHODS

(76) Inventor: Richard A. Blanchard, 10724 Mora Dr., Los Altos, CA (US) 94024-6530

( * ) Notice: Subject to any disclaimer, the term of this patent is extended or adjusted under 35 U.S.C. 154(b) by 218 days.

(21) Appl. No.: 11/272,477

(22) Filed: Nov. 9, 2005

Related U.S. Application Data

(60) Provisional application No. 60/626,394, filed on Nov. 9, 2004.

(51) Int. Cl.
*H01L 29/76* (2006.01)
(52) U.S. Cl. .................. 257/342; 257/341; 257/343; 257/E29.256; 257/339
(58) Field of Classification Search .............. 257/213, 257/513, 335, 401, 339–343, E29.256
See application file for complete search history.

(56) References Cited

U.S. PATENT DOCUMENTS

| | | | | |
|---|---|---|---|---|
| 6,512,268 B1* | 1/2003 | Ueno | ................. | 257/341 |
| 6,525,372 B2* | 2/2003 | Baliga | ................. | 257/328 |
| 6,555,873 B2* | 4/2003 | Disney et al. | ................. | 257/342 |
| 6,894,349 B2* | 5/2005 | Beasom | ................. | 257/343 |
| 6,906,381 B2* | 6/2005 | Peyre-Lavigne et al. | .... | 257/333 |
| 2002/0185679 A1* | 12/2002 | Baliga | ................. | 257/329 |
| 2005/0001268 A1* | 1/2005 | Baliga | ................. | 257/341 |

* cited by examiner

*Primary Examiner*—Zandra Smith
*Assistant Examiner*—Telly D Green
(74) *Attorney, Agent, or Firm*—Groover & Associates

(57) ABSTRACT

A lateral high-voltage active device structure, in which field-shaping trench electrodes are capacitively coupled to the voltage-withstand region near the source end thereof.

15 Claims, 7 Drawing Sheets

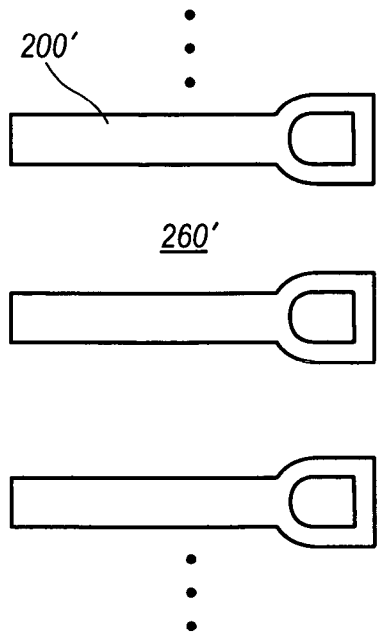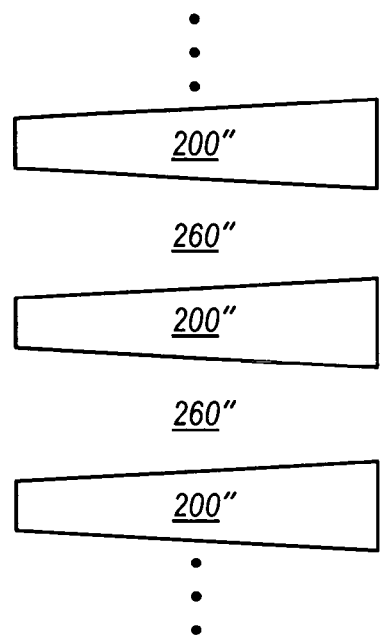
FIG. 5A
FIG. 5B
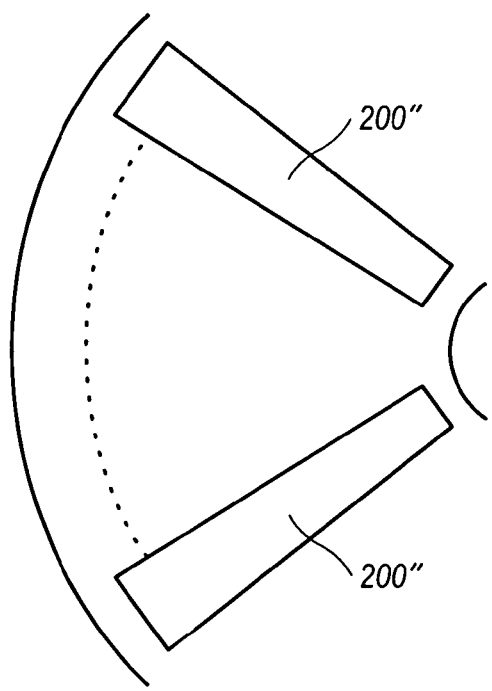
FIG. 5C

OXIDE-BYPASSED LATERAL HIGH VOLTAGE STRUCTURES AND METHODS

CROSS-REFERENCE TO RELATED APPLICATIONS

This application claims priority from U.S. provisional patent application 60/626,394 filed on Nov. 9, 2004, which is hereby incorporated by reference.

BACKGROUND AND SUMMARY OF THE INVENTIONS

The present application relates to semiconductor devices, and more particularly to devices which are capable of switching relatively high voltages, e.g. of 50V or more, while remaining reasonably compatible with integrated circuit fabrication techniques.

A MOS-gated transistor referred to as an "oxide-bypassed" VDMOS transistor has been proposed for minimizing the specific on-resistance of devices. See Liang et al., "Oxide-Bypassed VDMOS (OBVDMOS): An Alternative to Superjunction High Voltage MOS Power Devices, 22 IEEE Electron Device Letters No. 8, August 2001, which is hereby incorporated by reference.

The structure shown in FIG. 1 was originally proposed, but several variations of this structure have been suggested. See e.g. Liang et al., "Tunable Oxide-Bypassed VDMOS (OB-VDMOS): Breaking the Silicon Limit for the Second Generation", ISPSD 2002; and Yang et al., "Tunable Oxide-Bypassed Trench Gate MOSFET: Breaking the Ideal Superjunction MOSFET Performance Line at Equal Column Width", 24 IEEE Electron Device Letters No. 11, November 2003; both of which are hereby incorporated by reference. In the OBVDMOS device shown in FIG. 1, the thick oxide 102 is capable of sustaining the high source-to-drain voltage (between source 120 and drain 130), while the buried pillars 110 of N+ or P+ polysilicon that are located on both sides of the voltage-withstand region 140 help to deplete the voltage-withstand region 140 of n-type carriers when there is a drain-to-source voltage present. For a specific voltage-withstand region width and doping concentration, the thickness of the oxide layer 102 between the N+ or P+ polysilicon 110 and the voltage-withstand region 140 can be selected to deplete the entire voltage-withstand region 140 at peak reverse bias.

Oxide-Bypassed Lateral High Voltage Structures and Methods

The present application describes a variety of lateral high-voltage active device structures and methods, in which field-shaping trench electrodes are capacitively coupled to the voltage-withstand region of a lateral semiconductor device. This provides many of the advantages of an "oxide-bypassed" device in a lateral device structure.

In one class of embodiments the voltage withstand region is itself tapered (wider near the drain end, in a unipolar device), to improve on-state conductivity.

The disclosed innovations, in various embodiments, provide one or more of at least the following advantages:

Improved on-resistance;
High degree of process compatibility with existing low-voltage processes;
Easy fabrication of integrated power devices.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3A shows an implementation with an n-type layer overlying a layer of silicon dioxide, FIG. 3B shows an implementation with an n-type layer formed on a p-type layer, and FIG. 3C shows an implementation with an n-type layer separated from the remainder of the substrate by a p-type buried layer.

FIG. 5A shows a further class of embodiments, in which the voltage-withstand regions are made wider at the drain end to improve the device "off" characteristics.

FIG. 5B shows a further class of embodiments, in which the voltage-withstand regions gradually widen from source to drain.

FIG. 5C shows a further class of embodiments, in which the trenches form part or all of a circle.

DETAILED DESCRIPTION OF THE PREFERRED EMBODIMENTS

The numerous innovative teachings of the present application will be described with particular reference to the presently preferred embodiment (by way of example, and not of limitation).

The present application describes an alternative structure, an oxide-bypassed lateral structure that can be used to fabricate lateral high voltage devices such as diodes, conventional MOSFETs, DMOSFETs, bipolar transistors, IGBTs, SCRs, and Triacs. An n-channel oxide-bypassed high voltage device uses the depletion region caused by the difference between the voltage on the conductor present at the sidewalls of the device and the voltage on the drain to prevent unwanted current flow between the drain and source of the device. An oxide-bypassed lateral high voltage structure has both its anode and its cathode on the surface of the semiconductor substrate. In an oxide-bypassed high voltage lateral DMOS transistor or "OBLDMOS" transistor, the gates that create the depletion regions that prevents unwanted current flow when the device is "off" is formed in a series of trenches that extend from the source region towards the drain region.

Figure 1:
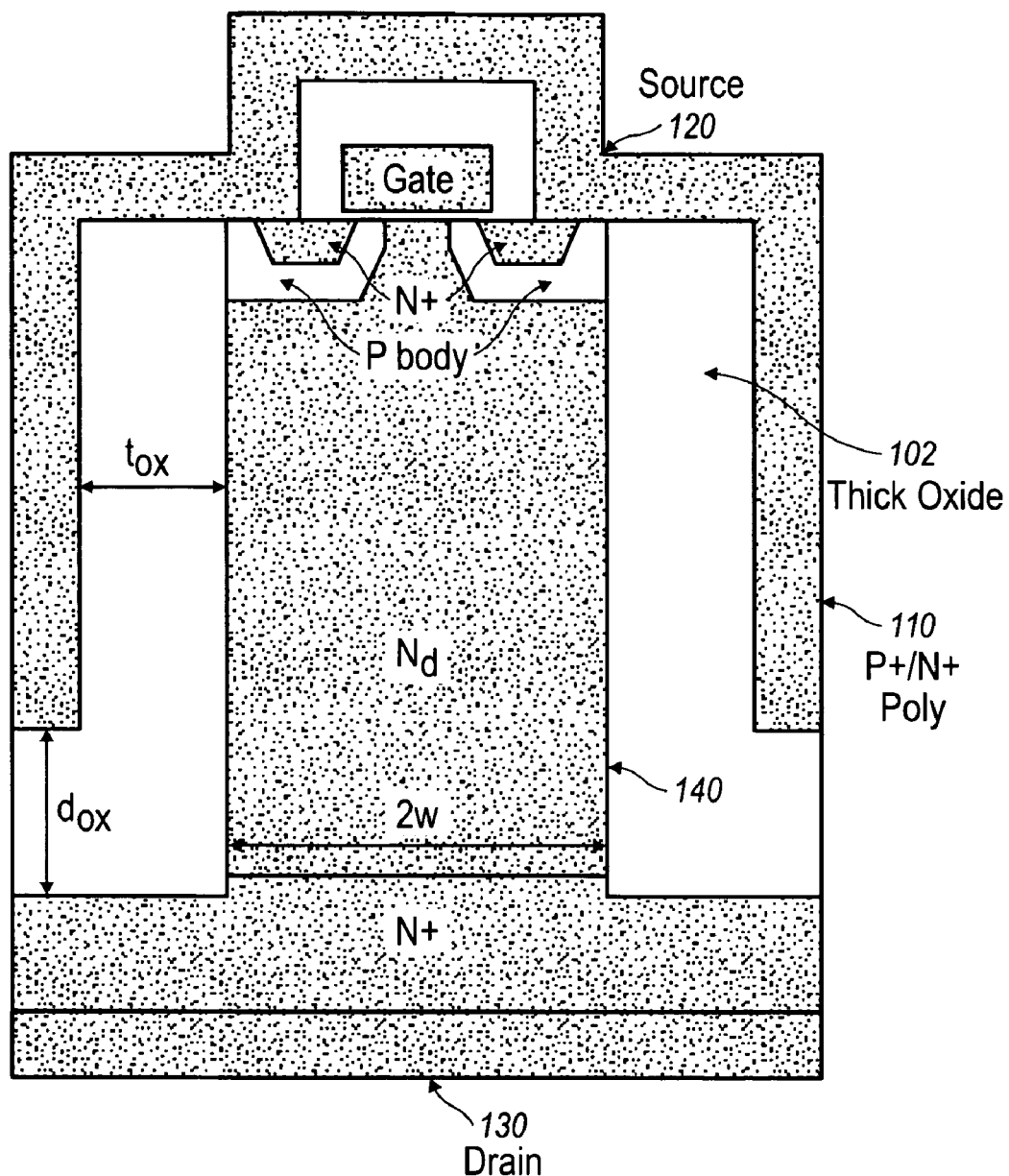
FIG. 1 shows a conventional device.
Figure 2A:
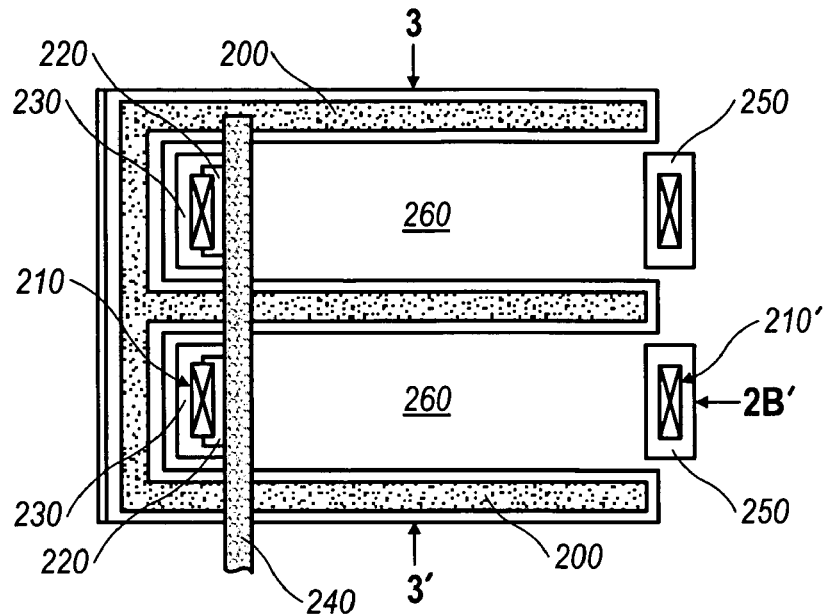
FIGS. 2A and 2B show top and side views of a sample embodiment of a high voltage oxide-bypassed lateral transistor structure.

A top view of a double-channel DMOSFET with three gates 200 that create the depletion region in the voltage-withstand region 260 is shown in FIG. 2A. The source 220 and body region 230 are on the left, with the drain 250 on the right. Gate 240 controls inversion of the channel 232 (seen in FIG. 2B), to thereby control electron injection from source 220 through channel 232 into voltage-withstand region 260. The structure shown is epitaxial, built on a p-type substrate 280. The structure shown includes two paralleled devices, controlled by a common gate 240, and both having a trench electrode 200 bordering opposite sides of a respective voltage withstand region 260.

Figure 2B:
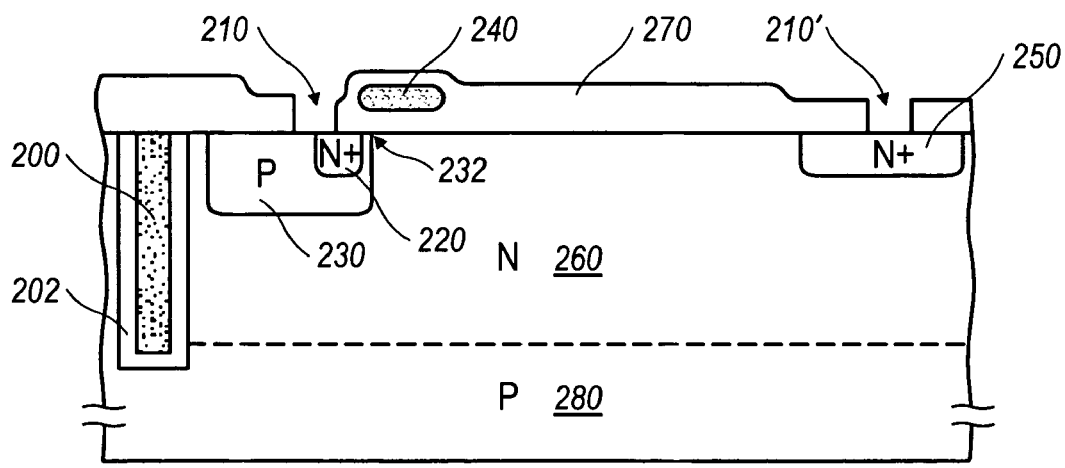

A top view is shown in FIG. 2A while a side view taken through the device at the arrows labeled 2B-2B' is shown in FIG. 2B. A contact 210, though thick oxide 270, permits contact to be made to source 220 and body 230. Similarly, another contact hole 210' permits contact to be made to the drain 250. The source 220 and body region 230 are surrounded by the trench 200 on the sides and end to prevent unwanted current flow. In this Figure the trench 200, and its insulation 202, are seen only in section, where the trench passes behind the body diffusion.

Figure 3A:
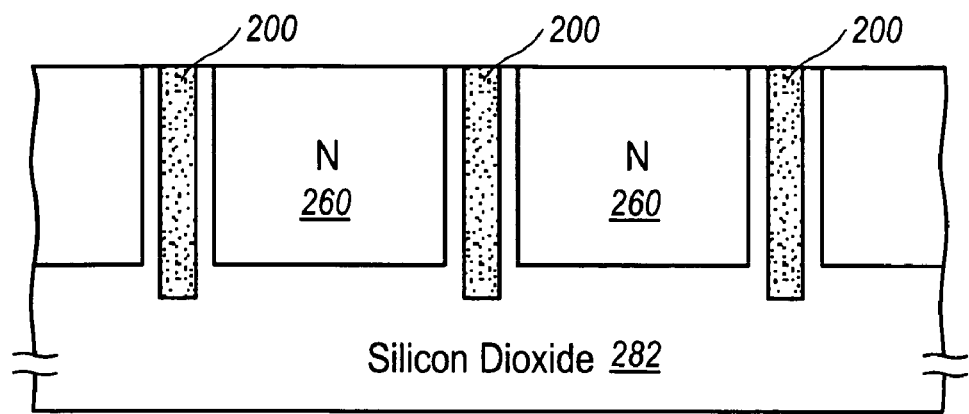
FIGS. 3A, 3B, and 3C show various possible structures for transistors of the type shown in FIGS. 2A/2B. Specifically.
Figure 3B:
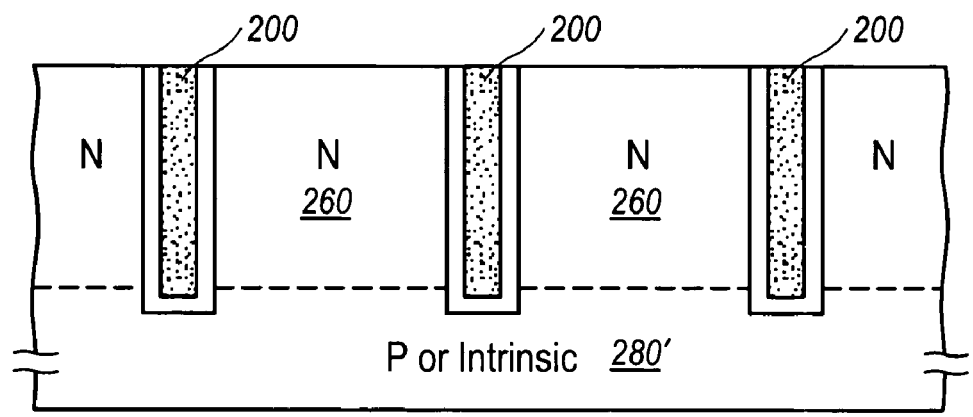
Figure 3C:
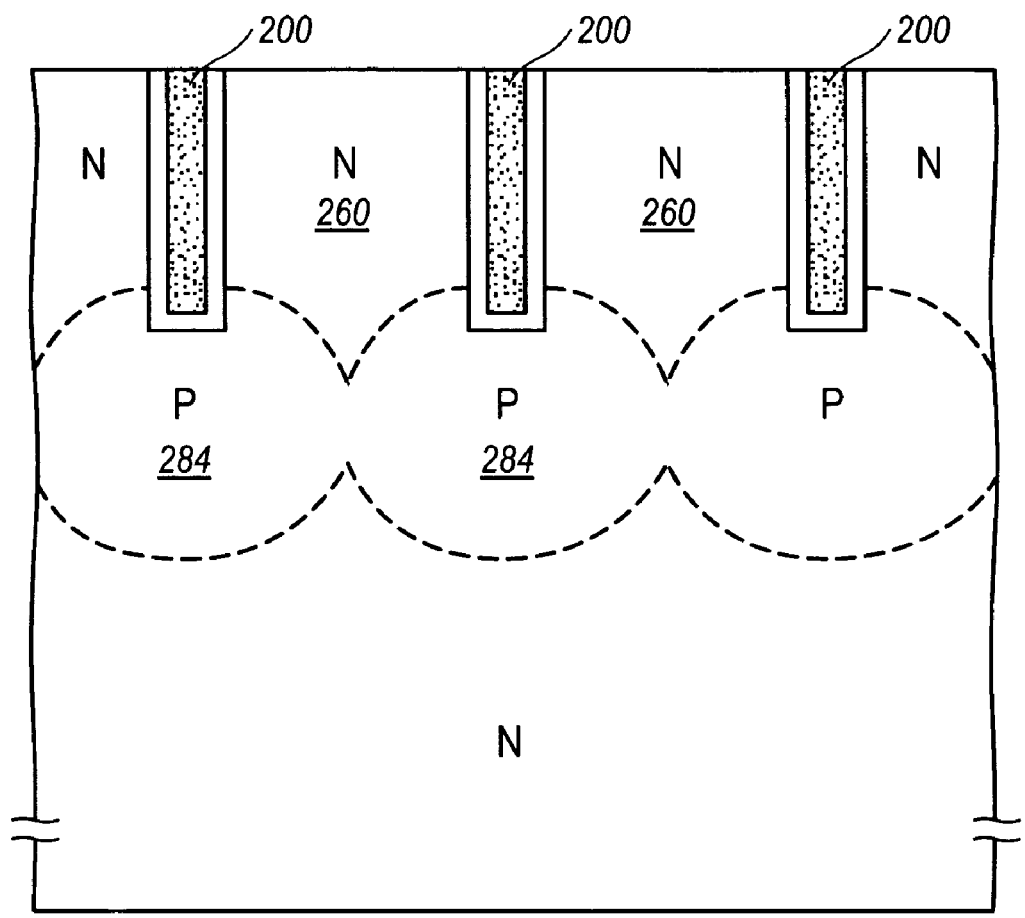

FIGS. 3A, 3B, and 3C show a few alternative structures for the device of FIG. 2A taken at the line 3-3'. FIG. 3A shows fabrication of an OBLDMOS transistor, including voltage-withstand regions 260 laterally gated by trench electrodes 200, in an n-type semiconductor layer that overlies a layer of silicon dioxide 282.

FIG. 3B shows the fabrication of an OBLDMOS transistor, including voltage-withstand regions 260 laterally gated by trench electrodes 200, in an n-type layer of semiconductor formed on a p-type or intrinsic layer 280'.

Figure 4A:
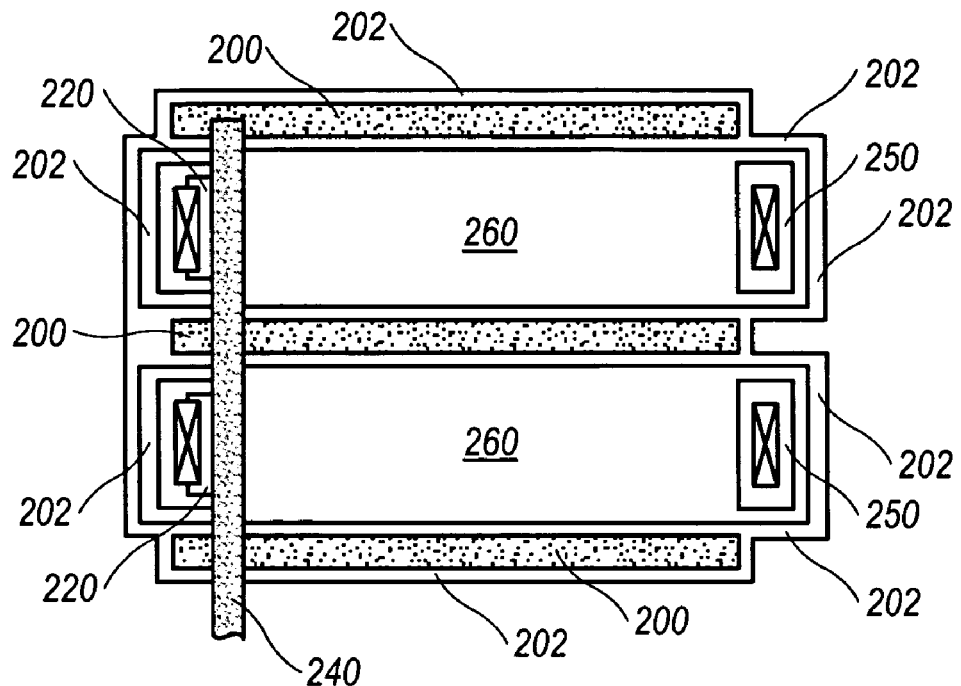
FIG. 4A shows an example of a transistor analogous to that shown in FIGS. 2A/B which is surrounded by isolation trenches.

FIG. 3C shows the fabrication of an OBLDMOS transistor, including voltage-withstand regions 260 laterally gated by trench electrodes 200, in an n-type semiconductor wafer, with a p-type buried layer 284 (outdiffused from the bottoms of the trenches 200) isolating the voltage-withstand regions 260 from the remainder of the wafer. (The trenches may even completely surround the device as shown in FIG. 4A.)

The OBLDMOS transistor shown in FIGS. 2A/B is fabricated in a wafer that is not electrically isolated from the remainder of the wafer; but alternatively this device can be isolated. FIG. 4A shows an example of a transistor which is generally analogous to that shown in FIGS. 2A/B, but which is surrounded by isolation trenches. In this example, the thick dielectric layer 202 that surrounds the trench electrode 200 continues completely around the transistor to electrically isolate it (even though the trench electrode itself is not extended beyond the borders of the voltage-withstand region 260). In this example, the separate illustrated portions of the trench electrode 200 are preferably electrically connected.

The high breakdown voltage of the structure does not require a special termination, since there is no electric field outside the device structure that is greater than the internal electric fields.

A particular advantage of this embodiment is that, if the active device is electrically isolated, it may be possible to "stack" devices electrically, to obtain higher operating voltages. (As will be understood by those of ordinary skill, the rating for the stacked combination of devices will be less than the sum of the voltage ratings of the individual devices, and external load-equalizing elements can optionally be used to avoid overvoltage on any one device.)

Figure 4B:
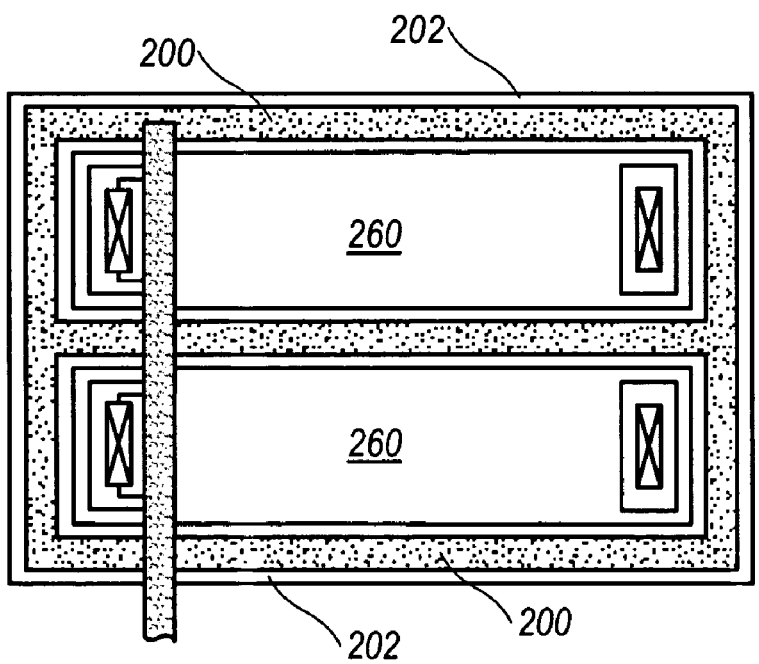
FIG. 4B shows a different way to achieve isolation.

FIG. 4B is a top view of a different isolation technique from that shown in FIG. 4A. In FIG. 4B, the trench with the field-shaping gate 200 extends to completely surround each section of the active device. This provides complete electrical isolation, not only of the device sections from each other, but also of the active devices from all other active or passive components on the chip. Note that this embodiment has (at least) similar advantages to that of FIG. 4A.

FIG. 5A shows a further class of embodiments, in which the trench gates 200' are patterned to be wider at the drain end. Since the extra width encroaches on the voltage-withstand region, it can be seen that the resulting voltage-withstand regions 200' are therefore narrower at the drain end. This facilitates pinch-off near the drain end (where the voltage-withstand region 260' is narrowed), while preserving as much on-state conductivity as possible (since the voltage-withstand region 260' is not narrowed except near the drain end).

FIG. 5B shows a further class of embodiments, in which the trench gates 200" are patterned to gradually widen from the source end to the drain end. Since the extra width encroaches on the voltage-withstand region, it can be seen that the resulting voltage-withstand regions 260" become gradually narrower toward the drain end. This facilitates pinch-off near the drain end (where the voltage-withstand region 260' is narrowed), while preserving some on-state conductivity (since the voltage-withstand region 260" is still wide near the source end).

FIG. 5C shows a further class of embodiments, in which the tapered trenches 200" form part or all of a circle. In this embodiment the voltage-withstand regions can be e.g. constant-width regions 260 as in FIG. 2A, or tapered regions 260" as in FIG. 5B (though preferably with a slower taper than the taper of the trenches).

Figure 2C:
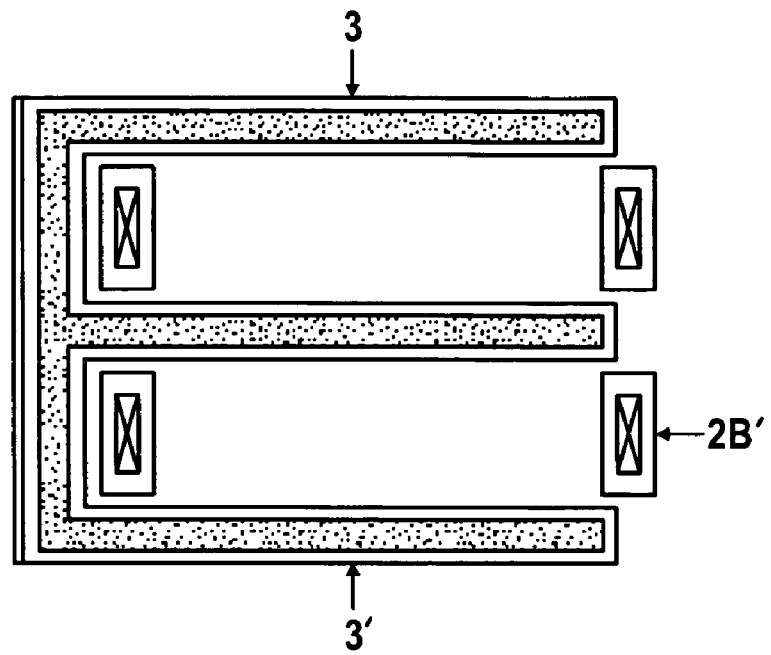
FIGS. 2C and 2D show top and side views of a sample embodiment of a high voltage oxide-bypassed lateral transistor structure.
Figure 2D:
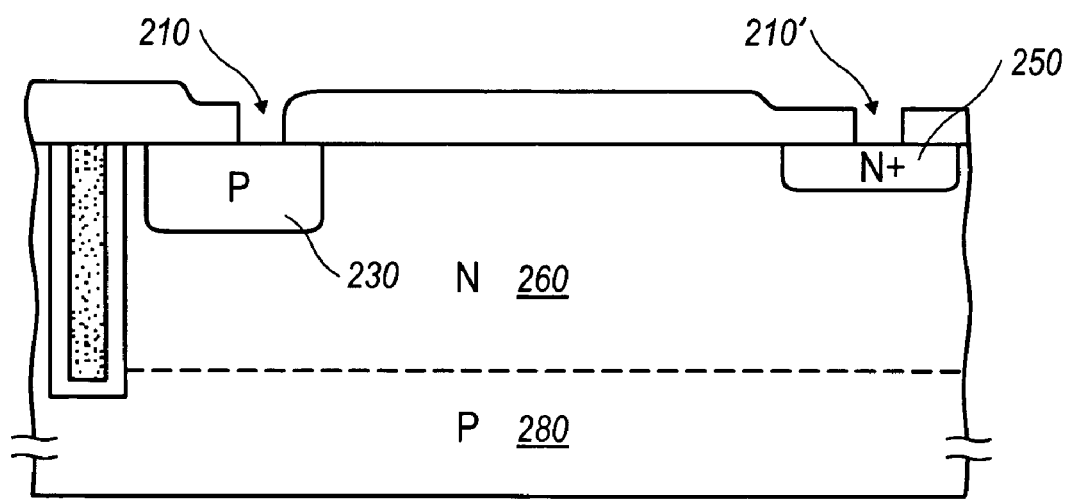

FIGS. 2C and 2D show how the embodiments of FIGS. 2A/B (and/or FIGS. 3A, 3B, 3C, 4A, 4B, 5A, 5B, and/or 5C) can be adapted to construct a high voltage diode. In this embodiment there is no source diffusion nor control gate. Instead the body diffusion 230 serves as the anode, and the diffusion 250 now serves as the cathode. The gates 200 still help to deplete the voltage-withstand region 260, as in the embodiment of FIG. 2A. Again, the structure shown includes two devices, both having a trench electrode 200 bordering opposite sides of a respective voltage withstand region 260.

According to a disclosed class of innovative embodiments, there is provided: a lateral semiconductor device, comprising: a carrier-emission structure; a voltage-withstand structure, through which carriers emitted by said carrier-emission structure can pass; and trench electrodes which are capacitively coupled to sidewalls of said voltage-withstand structure to provide electric field shaping therein.

According to a disclosed class of innovative embodiments, there is provided: a lateral semiconductor device, comprising: a carrier-emission structure, which can emit charge carriers of a first type; a voltage-withstand structure, through which carriers emitted by said carrier-emission structure can pass; a carrier-collection structure, which receives charge carriers of said first type which have passed through said voltage-withstand structure; and trench electrodes which adjoin opposite sides of said voltage-withstand structure, and which have sidewalls capacitively coupled to provide electric field shaping in said voltage-withstand structure.

According to a disclosed class of innovative embodiments, there is provided: a lateral semiconductor device, comprising: a carrier-emission structure; and a voltage-withstand structure which is extended parallel to the surface of a monolithic semiconductor mass, and positioned so that carriers emitted by said carrier-emission structure pass through said voltage-withstand structure; and trench electrodes which are also extended parallel to said surface, and which adjoin opposite sides of said voltage-withstand structure near said carrier-emission structure.

According to a disclosed class of innovative embodiments, there is provided: a lateral semiconductor device, comprising: a carrier-emission structure which can emit charge carriers of a first type; a voltage-withstand structure, through which carriers emitted by said carrier-emission structure can pass; a carrier-collection structure which receives charge carriers of said first type which have passed through said voltage-withstand structure; and trench electrodes which adjoin opposite sides of said voltage-withstand structure, and which have sidewalls capacitively coupled to provide electric field shaping in said voltage-withstand structure; wherein said trench electrodes are not parallel, and are farther apart in proximity to said carrier-emission structure.

According to a disclosed class of innovative embodiments, there is provided: a method for operating a lateral semiconductor device, comprising the actions of: emitting charge carriers from a carrier-emission structure into a voltage-withstand structure; while modifying the electric field within said voltage-withstand structure, using trench electrodes which are capacitively coupled to sidewalls of said voltage-withstand structure to provide electric field shaping therein.

According to a disclosed class of innovative embodiments, there is provided: a method for operating a lateral semiconductor device, comprising the actions of: in the ON state, emitting charge carriers from a carrier-emission structure into a voltage-withstand structure, said carriers passing through said voltage-withstand structure to a carrier-collection structure; and in both ON and OFF states, modifying the electric field within said voltage-withstand structure, using trench electrodes which are capacitively coupled to opposite sidewalls of said voltage-withstand structure to provide electric field shaping therein.

According to a disclosed class of innovative embodiments, there is provided: a method for operating a lateral semiconductor device, comprising the actions of: in the ON state, allowing charge carriers to flow from a carrier-emission structure, through a voltage-withstand structure, to a carrier-collection structure; and in both ON and OFF states, modifying the electric field within said voltage-withstand structure, using trench electrodes which are capacitively coupled to sidewalls of said voltage-withstand structure to provide electric field shaping therein; wherein said trench electrodes are not parallel, and are closer together in proximity to said carrier-emission structure than in proximity to said carrier-collection structure.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given.

The claimed inventions are not limited to the geometries shown in the figures: as will be appreciated by those skilled in the art, a wide variety of other geometries can be implemented within the scope of the functional relations set forth above.

Optionally some "resurf" structure can be added to the lateral devices shown, for additional field-shaping.

For another example, the semiconductor material can be silicon, or SiGe, or SiC, or various SiGeC alloys. The disclosed structures can also be adapted to GaAs, InP, GaN, other III-V binary or pseudo-binary semiconductor materials, or to other semiconductors to the extent the processes are available.

For another example, the insulators used are not strictly limited to silicon dioxide, but can be oxynitrides or other process-compatible dielectric.

For another example, the conductive polysilicon material can alternatively (but less preferably) be replaced by another conductor with good conformal deposition characteristics, e.g. tungsten or a metal silicide.

For another example, other device types, beyond a simple FET, can optionally be constructed using the disclosed teachings.

The materials referred to herein, such as the materials used for conductors or capacitors, or the types of doping used in a material, are not intended to limit the scope of the present innovations. Other materials may be substituted for the examples given herein without deviating from the scope of the present innovations.

For another example, the structures described above can also be used with power devices which include graded bandgap or heterostructures.

For another example, the structures described above can also be used with various kinds of "drain engineering," e.g. with one or more lighter diffusions, of the same conductivity type as the drain, interposed between the voltage-withstand region and the most heavily-doped drain diffusion.

For another example, the structures described above can also be used in combination with field plates, additional diffusions, or other known ways to modify potential gradients and on-resistance.

Additional general background, which helps to show variations and implementations, may be found e.g. in the following publications, all of which are hereby incorporated by reference: Smart Power ICs (ed. Murari 2002); Benda et al., Discrete and Integrated Power Semiconductor Devices (1999); Sueker, Power Electronics Design (2005); B. J. Baliga, Silicon RF Power MOSFETs (2005); B. J. Baliga, Power Semiconductor Devices (1995); and the proceedings of the annual conferences of the International Symposium on Power Semiconductor Devices and ICs (ISPSD) from 1988 to 2005.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A lateral semiconductor device, comprising:
   a carrier-emission structure;
   a voltage-withstand structure, through which carriers are emitted by said carrier-emission structure can pass laterally; and
   trench electrodes which are capacitively coupled to sidewalls of said voltage-withstand structure to provide electric field shaping therein, wherein the voltage-withstand structure exhibits a lateral taper adjacent to a tapered drift region, said drift region narrower near a drain compared to wider nearer a source.

2. A lateral semiconductor device, comprising:
   a carrier-emission structure, which can emit charge carriers of a first type;
   a voltage-withstand structure, through which carriers emitted by said carrier-emission structure can pass laterally, adjacent to a laterally tapered dielectric structure;
   a carrier-collection structure, which receives charge carriers of said first type which have passed through said voltage-withstand structure; and
   trench electrodes which adjoin opposite sides of said voltage-withstand structure, and which have tapered sidewalls adjoining the tapered dielectric structure, said trench electrodes capacitively coupled to provide electric field shaping in said voltage-withstand structure.

3. A lateral semiconductor device, comprising:
   a carrier-emission structure; and
   a voltage-withstand structure which is extended parallel to the surface of a monolithic semiconductor mass, and positioned so that carriers emitted by said carrier-emission structure pass laterally through said voltage-withstand structure, including a laterally tapered dielectric structure narrower near the drain end; and trench electrodes which are also extended parallel to said surface, and which adjoin opposite sides of said voltage-withstand structure near said carrier-emission structure.

4. The device of claim 1, wherein said carrier-emission structure includes a source diffusion, and said trench electrodes are electrically connected to said source region.

5. The device of claim 1, wherein said carrier-emission structure includes an anode and a semiconductor diffusion abutting said anode.

6. The device of claim 1, wherein said carrier-emission structure includes a source diffusion, a semiconductor channel which abuts said source diffusion, and a gate which is capacitively coupled to said channel.

7. The device of claim 1, wherein said carrier-emission structure includes an emitter diffusion, and a base diffusion which has a conductivity type opposite to that of said emitter diffusion and said voltage-withstand region.

8. The device of claim 1, further comprising an electrical contact which receives carriers emitted by said carrier-emission structure, after said carriers have passed through said voltage-withstand region.

9. The device of claim 2, wherein said carrier-emission structure includes a source diffusion, a semiconductor channel which abuts said source diffusion, and a gate which is capacitively coupled to said channel.

10. The device of claim 2, wherein said carrier-collection structure also emits charge carriers of a second type, which can pass through said voltage-withstand region to said carrier-emission structure.

11. The device of claim 2, wherein said carrier-collection structure consists of a diffusion which has a conductivity type opposite to that of said voltage-withstand region.

12. The device of claim 2, wherein said carrier-emission structure includes a source diffusion, and said trench electrodes are electrically connected to said source region.

13. The device of claim 3, wherein said carrier-emission structure includes a source diffusion, a semiconductor channel which abuts said source diffusion, and a gate which is capacitively coupled to said channel.

14. The device of claim 3, further comprising an electrical contact which receives carriers emitted by said carrier-emission structure, after said carriers have passed through said voltage-withstand region.

15. The device of claim 3, wherein said carrier-emission structure includes a source diffusion, and said trench electrodes are electrically connected to said source region.

* * * * *